United States Patent
Yoshikawa

(10) Patent No.: US 8,901,966 B2
(45) Date of Patent: Dec. 2, 2014

(54) SENSOR CIRCUIT

(71) Applicant: Seiko Instruments Inc., Chiba-shi, Chiba (JP)

(72) Inventor: Kiyoshi Yoshikawa, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 14/179,220

(22) Filed: Feb. 12, 2014

(65) Prior Publication Data

US 2014/0225649 A1 Aug. 14, 2014

(30) Foreign Application Priority Data

Feb. 14, 2013 (JP) ................................ 2013-026905

(51) Int. Cl.
*G01R 19/00* (2006.01)
*G11C 7/00* (2006.01)

(52) U.S. Cl.
USPC ............ 327/52; 327/53; 327/54; 324/207.19; 324/526; 324/610; 324/657; 324/673

(58) Field of Classification Search
USPC ......... 327/52–54; 324/207.19, 526, 610, 657, 324/673, 680
See application file for complete search history.

(56) References Cited

U.S. PATENT DOCUMENTS

| 5,402,064 | A * | 3/1995 | Eck et al. ................. 324/207.21 |
| 5,440,234 | A * | 8/1995 | Kondo ........................... 324/526 |
| 7,956,598 | B2 * | 6/2011 | Ariyama ....................... 323/313 |
| 8,093,889 | B2 * | 1/2012 | Ariyama ....................... 324/225 |
| 8,723,594 | B2 * | 5/2014 | Sakaguchi .................... 327/538 |

FOREIGN PATENT DOCUMENTS

JP 2010-181211 A 8/2010

* cited by examiner

*Primary Examiner* — Kenneth B. Wells
(74) *Attorney, Agent, or Firm* — Brinks Gilson & Lione

(57) ABSTRACT

Provided is a sensor circuit which can amplify a sensor signal at high speed and with a high amplification factor without increasing the current consumption. The sensor circuit includes a primary amplifier for amplifying in advance a differential output signal which is a current signal of a sensor element, a secondary amplifier for amplifying the amplified differential output signal, a constant voltage generating circuit for maintaining a sensor element driving current to be constant, and a feedback circuit for feeding back a feedback signal to adjust an amplification factor. Most of the currents which pass through the primary amplifier are bias currents of the sensor element.

4 Claims, 5 Drawing Sheets

US 8,901,966 B2

SENSOR CIRCUIT

RELATED APPLICATIONS

This application claims priority under 35 U.S.C. §119 to Japanese Patent Application No. 2013-026905 filed on Feb. 14, 2013, the entire content of which is hereby incorporated by reference.

BACKGROUND OF THE INVENTION

1. Field of the Invention

The present invention relates to a sensor circuit, and more particularly, to a sensor circuit having a bridge sensor element.

2. Description of the Related Art

An output signal of a sensor element (sensor signal) is generally minute, and thus, is required to be amplified by a sensor circuit in order to be applied to an electronic circuit using a sensor element.

In recent years, miniaturization of electronic equipment is proceeding, and miniaturization of a sensor circuit built therein is also proceeding. Miniaturization of a sensor circuit results in a more minute sensor signal. In order to use a sensor signal which is a minute signal in ordinary electronic equipment, a higher amplification factor is necessary in an amplifier in the sensor circuit. On the other hand, a sensor circuit is required to operate at higher speed. A high amplification factor and high speed operation are generally mutually contradictory. In order to attain those requirements, hitherto, the current consumption of the amplifier is high (see, for example, Japanese Patent Application Laid-open No. 2010-181211).

SUMMARY OF THE INVENTION

However, electronic equipment, in particular, a mobile device driven by a battery, has a problem in that high current consumption is difficult to accept in a market.

The present invention has been made in view of those problems, and provides a sensor circuit which can amplify a sensor signal at high speed and with a high amplification factor without increasing the current consumption.

In order to solve the above-mentioned problems, according to one embodiment of the present invention, there is provided a sensor circuit including: a primary amplifier for amplifying in advance a differential output signal which is a current signal of a sensor element; a secondary amplifier for amplifying the amplified differential output signal; a constant voltage generating circuit for maintaining a sensor element driving current to be constant; and a feedback circuit for feeding back a feedback signal to adjust an amplification factor. Most of the currents which pass through the primary amplifier are bias currents of the sensor element.

According to the sensor circuit of the present invention, a sensor signal amplified by the primary amplifier is input to the secondary amplifier, and thus, the sensor circuit can amplify a sensor signal at high speed and with a high amplification factor.

Further, although the primary amplifier is added to the sensor circuit, most of the current consumption of the primary amplifier is used as a sensor element driving current, and thus, the current consumption of the sensor circuit almost does not increase.

DETAILED DESCRIPTION OF THE PREFERRED EMBODIMENTS

First Embodiment

Figure 1:
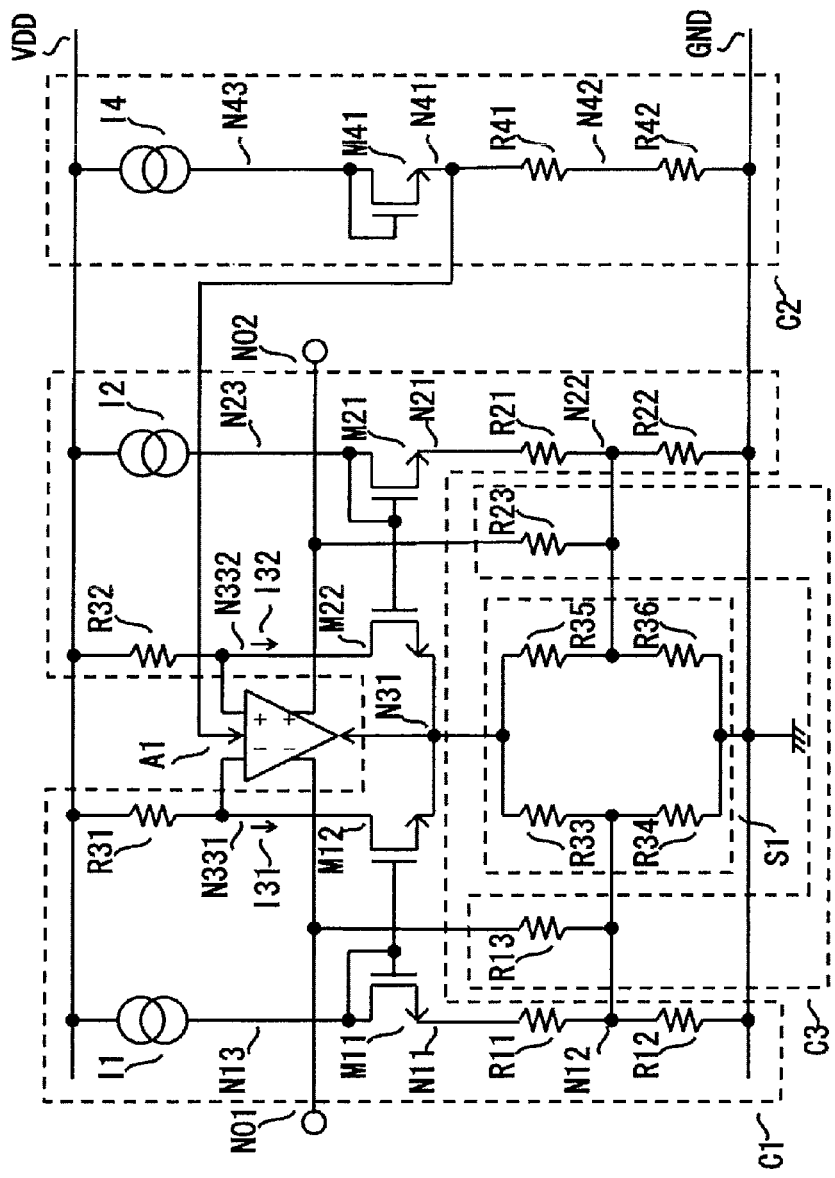
FIG. 1 is a circuit diagram illustrating a sensor circuit of a first embodiment of the present invention.

FIG. 1 is a circuit diagram illustrating a sensor circuit of a first embodiment of the present invention.

The sensor circuit of the first embodiment includes a sensor element S1, a primary amplifier C1 for amplifying in advance a differential output signal (sensor signal) which is a current signal of the sensor element S1, a secondary amplifier A1 for amplifying the amplified sensor signal, a constant voltage generating circuit C2 for maintaining a sensor element driving current to be constant, and a feedback circuit C3 for feeding back a feedback signal to adjust an amplification factor. In this case, most of the currents which pass through the primary amplifier C1 pass through the sensor element S1 as a bias current of the sensor element S1.

The sensor element S1 is formed as a bridge sensor element with four resistors R33 to R36 having the same resistance value. In other words, the sensor element S1 is an element represented as four equivalent bridge resistors.

In the primary amplifier C1, a gate and a drain of an NMOS transistor M11 are connected to a node N13, and a source of the NMOS transistor M11 is connected via serially connected resistors R11 and R12 to a ground terminal. A constant current source I1 is provided between a power supply terminal and the node N13. A gate and a drain of an NMOS transistor M21 are connected to a node N23, and a source of the NMOS transistor M21 is connected via serially connected resistors R21 and R22 to the ground terminal. A constant current source I2 is provided between the power supply terminal and the node N23. A gate of an NMOS transistor M12 is connected to the node N13, a source of the NMOS transistor M12 is connected to a node N31, and a drain of the NMOS transistor M12 is connected via a resistor R31 to the power supply terminal. A gate of an NMOS transistor M22 is connected to the node N23, a source of the NMOS transistor M22 is connected to the node N31, and a drain of the NMOS transistor M22 is connected via a resistor R32 to the power supply terminal. A node N331 is a node with the drain of the NMOS transistor M12. A node N332 is a node with the drain of the NMOS transistor M22. A node N11 is the source of the NMOS transistor M11. A node N21 is the source of the NMOS transistor M21.

A non-inverting input terminal of the secondary amplifier A1 is connected to the node N332, an inverting input terminal of the secondary amplifier A1 is connected to the node N331, a non-inverting output terminal of the secondary amplifier A1 is connected to a non-inverting output terminal NO2 of the sensor circuit, and an inverting output terminal of the secondary amplifier A1 is connected to an inverting output terminal NO1 of the sensor circuit. An output common voltage feedback terminal of the secondary amplifier A1 is connected to the node N31 which is a node for supplying a sensor element driving current. An output common voltage input terminal of the secondary amplifier A1 is connected to a node N41 which is a node for supplying an output common voltage of the secondary amplifier A1.

In the constant voltage generating circuit C2, a gate and a drain of an NMOS transistor M41 are connected to a node N43, and a source of the NMOS transistor M41 is connected via serially connected resistors R41 and R42 to the ground terminal. A constant current source I4 is provided between the power supply terminal and the node N43. The node N41 is the source of the NMOS transistor M41.

In the feedback circuit C3, a resistor 13 is provided between the inverting output terminal NO1 of the sensor circuit and a node N12. A resistor 23 is provided between the non-inverting output terminal NO2 of the sensor circuit and a node N22.

In this case, the constant current sources I1 and I2 cause the same amount of constant currents to pass through. The NMOS transistor M11 and the NMOS transistor M21 are of the same size. The NMOS transistor M12 and the NMOS transistor M22 are of the same size. The resistors R11 to R13, the resistors R21 to R23, and the resistors R41 and R42 are formed of a material which is the same as that of the sensor element S1. The resistance values of the resistors R11 and R12 and the resistors R21 and R22 are the same. The resistance values of the resistors R41 and R42 are the same.

Further, the resistance values of the resistors R11 to R13 are regarded as R11 to R13, the resistance values of the resistors R21 to R23 are regarded as R21 to R23, the resistance values of the resistors R31 to R36 are regarded as R31 to R36, and the resistance values of the resistors R41 and R42 are regarded as R41 and R42, respectively. The current values of the constant current sources I1 and I2 are regarded as I1 and I2, respectively, and the current value of the constant current source I4 is regarded as I4. Then, the size ratio of the NMOS transistor M11 to the NMOS transistor M12 is represented as:

1/(R11+R12):1/(R33+R34), the size ratio of the NMOS transistor M21 to the NMOS transistor M22 is represented as:

1/(R21+R22):1/(R35+R36), and the size ratio of the NMOS transistor M11 and the NMOS transistor M41 is represented as:

1/(R11+R12):1/(R41+R42), and is also represented as:

I1:I4.

Next, operation of the sensor circuit according to the first embodiment is described.

In this case, the sensor element S1 outputs, based on the bias current which passes between the node N31 and the ground terminal and physical quantities such as an applied magnetic force, a differential output signal (sensor signal) which is a current signal of the sensor element S1, to the node N12 and the node N22. Further, the constant voltage generating circuit C2 generates a constant voltage at the node N41 based on the constant current of the constant current source I4 and the resistance values of the resistors R41 and R42. The constant voltage is input to the output common voltage input terminal of the secondary amplifier A1 to be the output common voltage of the secondary amplifier A1. The secondary amplifier A1 controls the voltages at the non-inverting output terminal and the inverting output terminal so that the voltage at the output common voltage input terminal and the voltage at the output common voltage feedback terminal are the same. The output common voltage feedback terminal of the secondary amplifier A1 is connected to the node N31, and thus, the voltage at the node N31 and the voltage at the node N41 are the same.

When there is no physical quantity such as a magnetic force applied to the sensor element S1, the resistance values of the resistors R11 and R12 vary depending on the temperature, and thus, the voltage at the node N11 also varies. Similarly, the resistance values of the resistors R33 to R36 vary, and thus, the voltage at the node N31 also varies. However, the resistors R11 and R12 are formed of a material which is the same as that of the resistors R33 to R36 of the sensor element S1, and thus, the temperature-resistance characteristics thereof are the same. Therefore, the variation amounts of the resistance values of the resistors R11 and R12 and the resistors R33 to R36 with respect to the temperature are the same. Then, it follows that the voltage at the node N11 and the voltage at the node N31 are the same, which are I1×(R11+R12). Similarly, the voltage at the node N11, the voltage at the node N21, the voltage at the node N31, and the voltage at the node N41 are all the same. In this case, the voltage at a node between the resistor R33 and the resistor R34 and the voltage at the node between the resistor R11 and the resistor R12 are the same, and thus, a current is not caused to pass therebetween. Similarly, the voltage at a node between the resistor R35 and the resistor R36 and the voltage at the node between the resistor R21 and the resistor R22 are the same, and thus, a current is not caused to pass therebetween.

Note that, when the resistance values of the resistor R12 and the resistor R22 vary depending on the temperature, the output common voltages of the secondary amplifier A1 at the nodes NO1 and NO2 also vary by the variations in resistance.

When there is a physical quantity such as a magnetic force applied to the sensor element S1, the sensor signal is output to the node N12 to be caused to pass to the resistor R12. The sensor signal is also output to the node N22 to be caused to pass to the resistor R22. Therefore, a voltage difference ΔV12 is caused between the node N12 and the node N22. The level of the voltage difference ΔV12 is shifted and the shifted level propagates to the node N13 and the node N23 to be input to the gates of the NMOS transistor M12 and the NMOS transistor M22, respectively.

Due to the voltage difference ΔV12, a current which passes through the resistor R31 and a current which passes through the resistor R32 vary in accordance with transconductance gm3 between the NMOS transistor M12 and the NMOS transistor M22. Therefore, a voltage difference ΔV331 is caused between the node N331 and the node N332. The voltage difference ΔV331 is (gm3×R31) times as much as the voltage difference ΔV12. Generally, (gm3×R31)≈10 is secured with ease, and the amplitude of a signal which is input to the secondary amplifier A1 becomes about 10(R12)/(R12+R34) times as much due to the presence of the primary amplifier C1.

The voltage difference ΔV331 is amplified by the secondary amplifier A1, and is fed back to the node N12 and the node N22 by the resistor R13 and the resistor R23, respectively. In this case, the resistor R13 and the resistor R23 feed back the feedback signal to adjust the amplification factor, and the primary amplifier C1 and the secondary amplifier A1 operate so as to cancel out the variations in sensor signal. After the feedback, when the sensor signal stands still, the state of operation of the primary amplifier C1 becomes the same as that when there is no sensor signal.

Note that, the differential output signal (sensor signal) which is a current signal of the sensor element S1 depends on the resistance values of the resistors R33 to R36, and thus, when these resistance values vary depending on the temperature, the sensor signal also varies. However, the resistor R13, the resistor R23, and the resistors R33 to R36 are formed of the same material, and thus, the temperature-resistance characteristics thereof are the same. Therefore, the variation amounts of the resistance values of the resistor R13, the resistor R23, and the resistors R33 to R36 with respect to the temperature are the same. In other words, the ratio of the resistance values of these resistors does not vary. Further, due to the dependence of these resistance values on temperature, the current signal of the sensor element S1 varies. Therefore, the voltages at the nodes NO1 and NO2 do not vary and do not depend on the temperature. The necessity of a temperature compensating circuit for compensating for the dependence on temperature is eliminated, which results in reduced scale of the sensor circuit and reduced current consumption.

Second Embodiment

Figure 2:
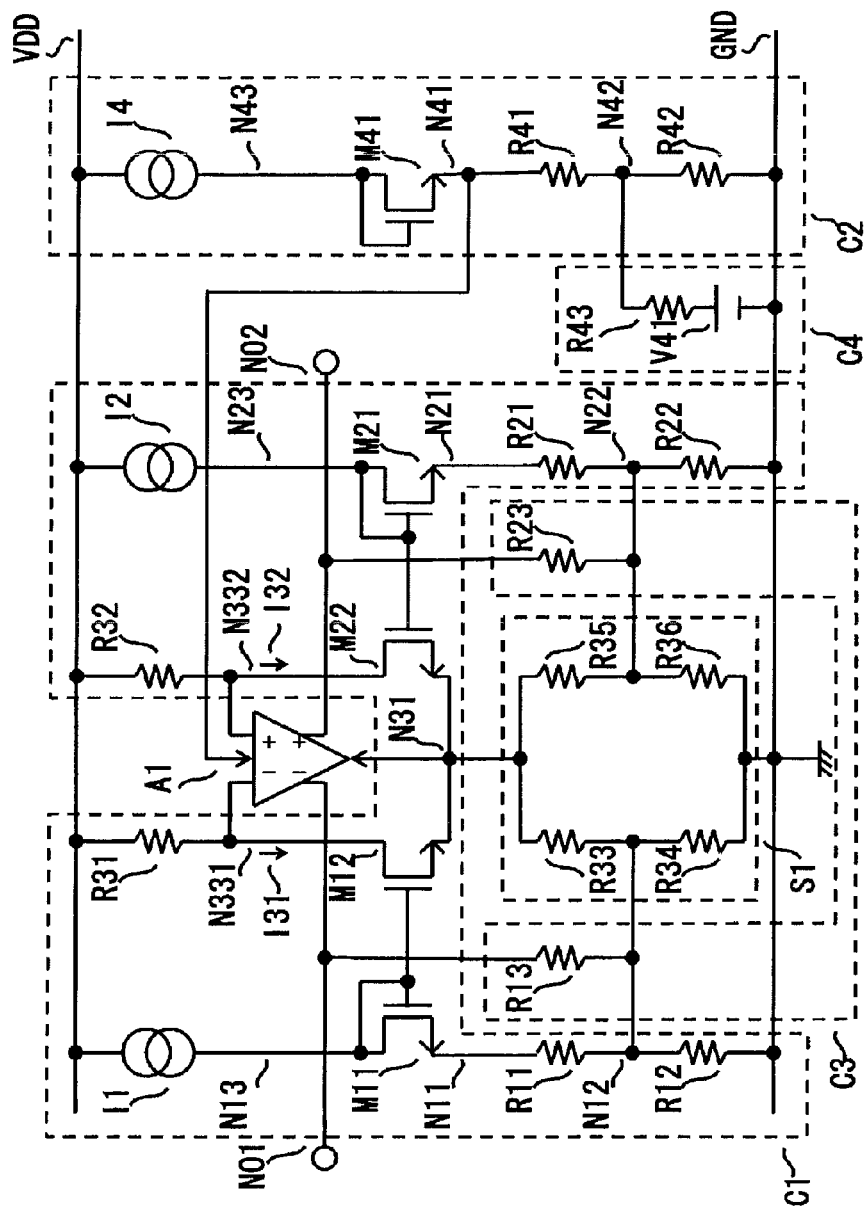
FIG. 2 is a circuit diagram illustrating a sensor circuit of a second embodiment of the present invention.

FIG. 2 is a circuit diagram illustrating a sensor circuit of a second embodiment of the present invention.

In the sensor circuit of the second embodiment, an output common voltage adjustment circuit C4 is added to the sensor circuit of the first embodiment. A reference voltage generating circuit V41 for generating a desired reference voltage is connected to a node N42 via a resistor R43. The resistance value of the resistor R43 is, for example, R13×(1+R12/R34). In the sensor circuit of the first embodiment, the output common voltages of the secondary amplifier A1 at the nodes NO1 and NO2 are (I1×R12). However, in the sensor circuit of the second embodiment, the output common voltages may be a desired voltage.

Third Embodiment

Figure 3:
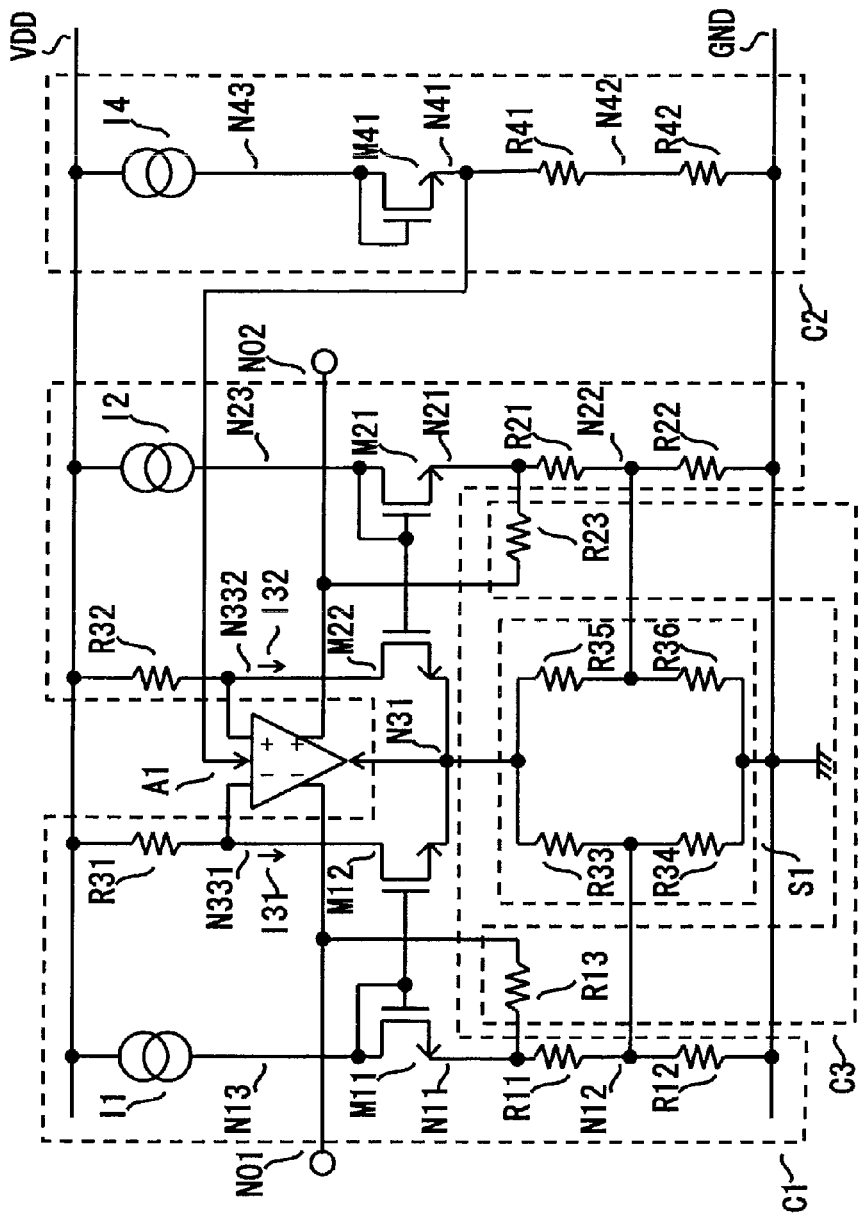
FIG. 3 is a circuit diagram illustrating a sensor circuit of a third embodiment of the present invention.

FIG. 3 is a circuit diagram illustrating a sensor circuit of a third embodiment of the present invention.

In the sensor circuit of the third embodiment, the resistor R13 and the resistor R23 in the feedback circuit C3 are connected differently. In the sensor circuit of the first embodiment, the resistor R13 and the resistor R23 are connected to the node N12 and the node N22, respectively. However, in the sensor circuit of the third embodiment, the resistor R13 and the resistor R23 may be connected to the resistor N11 and the resistor N21, respectively. When there is no physical quantity such as a magnetic force applied to the sensor element S1, in the sensor circuit of the first embodiment, the output common voltages of the secondary amplifier A1 at the nodes NO1 and NO2 are voltages at the node N12 and at the node N22, respectively, which are lower than the power supply voltage. However, in the sensor circuit of the third embodiment, the output common voltages are voltages at the node N11 and at the node N21, respectively, which are higher than those in the case illustrated in FIG. 1. Enlargement of the amplitudes of the sensor signals at the nodes NO1 and NO2 is enabled, which leads to a higher amplification factor of the sensor signals accordingly.

Fourth Embodiment

Figure 4:
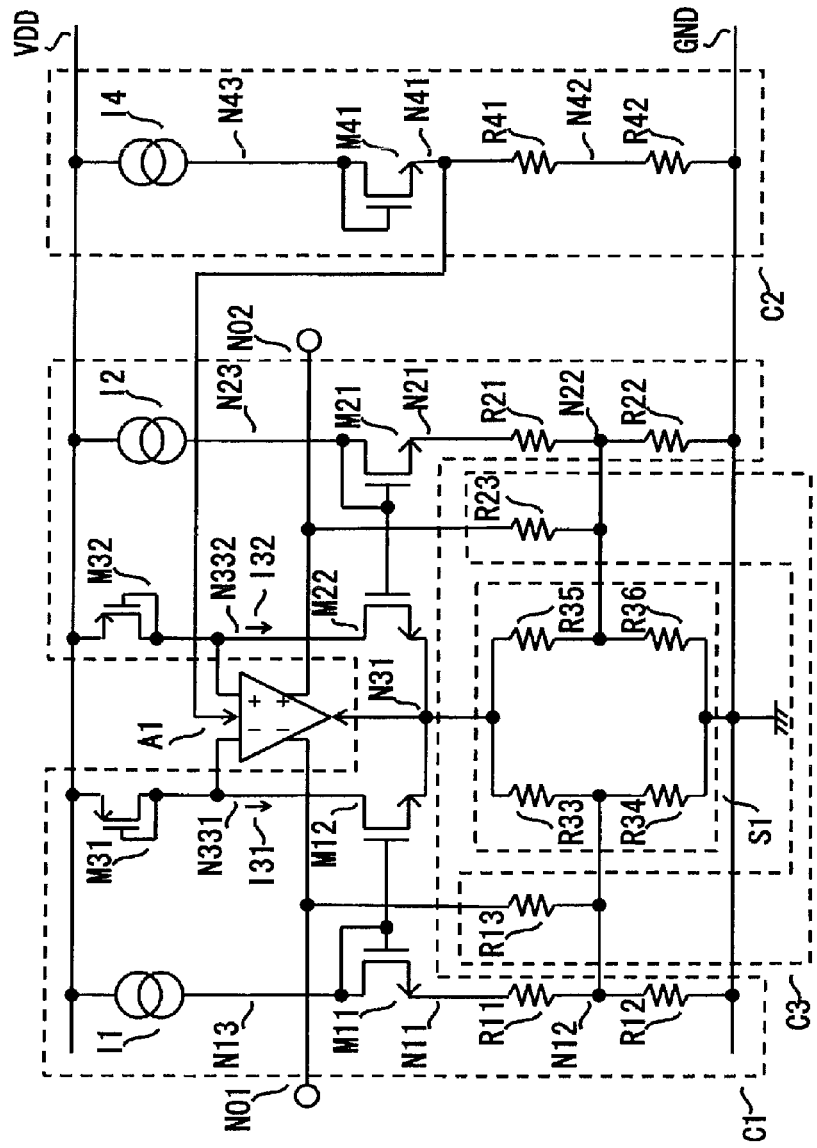
FIG. 4 is a circuit diagram illustrating a sensor circuit of a fourth embodiment of the present invention.

FIG. 4 is a circuit diagram illustrating a sensor circuit of a fourth embodiment of the present invention.

In the sensor circuit of the fourth embodiment, the resistors R31 and R32 in the primary amplifier C1 are replaced by diode connected PMOS transistors M31 and M32, respectively.

In the sensor circuit of the first embodiment, when the resistance value of the sensor element S1 becomes higher depending on the temperature, the voltage at the node N31 also becomes higher, and the drain-source voltages of the NMOS transistor M12 and the NMOS transistor M22 become lower. In this case, when, due to a physical quantity such as a magnetic force applied to the sensor element S1, the voltage at the node N12 or the node N22 is lowered and the voltage at the node N331 or the node N332 is lowered, the drain-source voltage of the NMOS transistor M12 or the NMOS transistor M22 becomes further lower. Then, the NMOS transistor M12 or the NMOS transistor M22 cannot operate normally.

In the sensor circuit of the fourth embodiment, owing to a physical quantity such as a magnetic force applied to the sensor element S1, the voltages at the nodes N331 and N332 are less liable to vary. Therefore, the drain-source voltages of the NMOS transistor M12 and the NMOS transistor M22 are less liable to be lowered.

Fifth Embodiment

Figure 5:
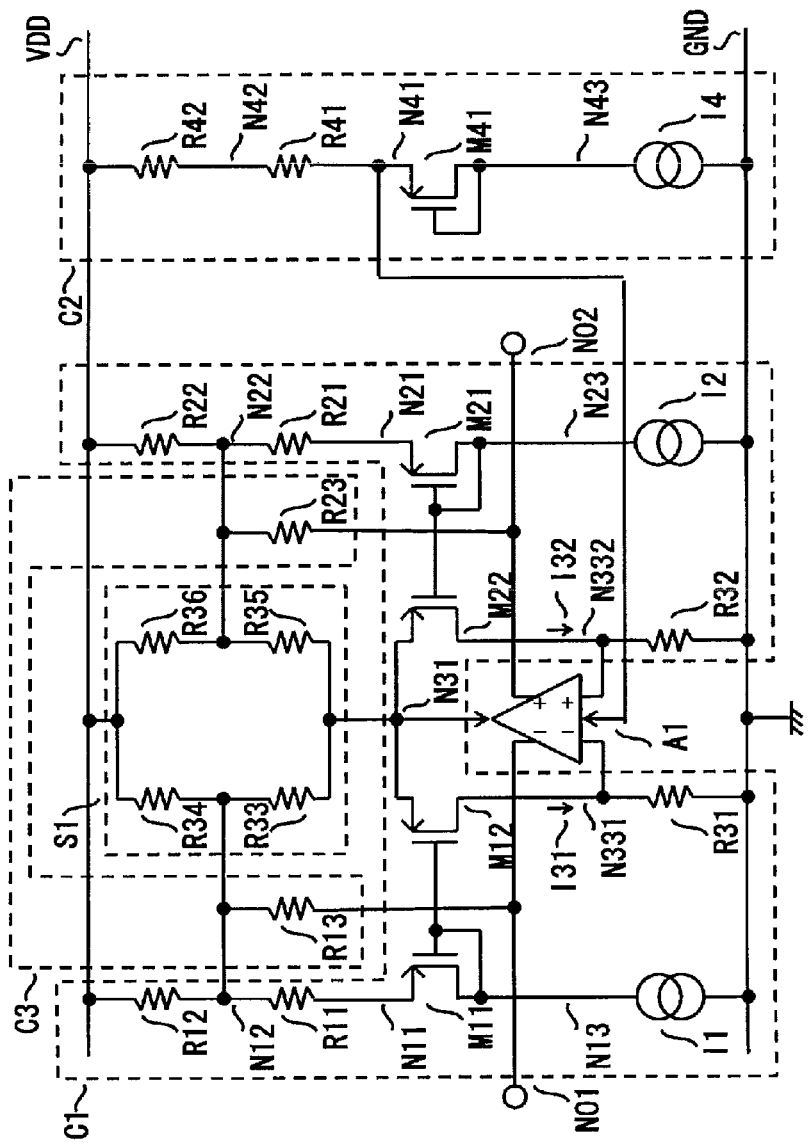
FIG. 5 is a circuit diagram illustrating a sensor circuit of a fifth embodiment of the present invention.

FIG. 5 is a circuit diagram illustrating a sensor circuit of a fifth embodiment of the present invention.

As in the sensor circuit of the fifth embodiment, by reversely connecting the structural elements to the power supply terminal and the ground terminal and replacing the NMOS transistors with PMOS transistors, effects similar to those of the other embodiments can be obtained. In the sensor circuit of the fifth embodiment, the structural elements of the sensor circuit of the first embodiment are reversely connected to the power supply terminal and the ground terminal, but the same applies to the other embodiments.

What is claimed is:

1. A sensor circuit for amplifying and outputting a voltage which is generated by a sensor element comprising a first input terminal, a second input terminal, a first output terminal, and a second output terminal and comprising four equivalent bridge resistors, the sensor circuit comprising:
a primary amplifier comprising:
a first constant current source, a first MOS transistor, and a first resistor and a second resistor which are serially connected between a power supply terminal and a ground terminal;
a second constant current source, a second MOS transistor, and a third resistor and a fourth resistor which are serially connected between the power supply terminal and the ground terminal;
a first resistance component and a third MOS transistor which is current mirror connected to the first MOS transistor, the first resistance component and the third MOS transistor being serially connected between the power supply terminal and the first input terminal of the sensor element; and
a second resistance component and a fourth MOS transistor which is current mirror connected to the second MOS transistor, the second resistance component and the fourth MOS transistor being serially connected between the power supply terminal and the first input terminal of the sensor element,
the first resistor and the second resistor including a node which is connected to the first output terminal of the sensor element,
the third resistor and the fourth resistor including a node which is connected to the second output terminal of the sensor element;
a constant voltage generating circuit for generating a constant voltage, the constant voltage generating circuit comprising a third constant current source, a fifth MOS transistor, and a fifth resistor and a sixth resistor which are serially connected between the power supply terminal and the ground terminal;

a secondary amplifier, the secondary amplifier including:
  an inverting input terminal which is connected to a drain of the third MOS transistor;
  a non-inverting input terminal which is connected to a drain of the fourth MOS transistor;
  an inverting output terminal which is connected to an inverting output terminal of the sensor circuit;
  a non-inverting output terminal which is connected to a non-inverting output terminal of the sensor circuit;
  an output common voltage input terminal for inputting the constant voltage; and
  an output common voltage feedback terminal for inputting a voltage at the first input terminal of the sensor element; and
a feedback circuit comprising:
  a seventh resistor provided between the inverting output terminal of the secondary amplifier and the first output terminal of the sensor element; and
  an eighth resistor provided between the non-inverting output terminal of the secondary amplifier and the second output terminal of the sensor element.

2. A sensor circuit according to claim 1,
wherein one end of the seventh resistor is connected to the inverting output terminal of the secondary amplifier and another end of the seventh resistor is connected to the first output terminal of the sensor element, and
wherein one end of the eighth resistor is connected to the non-inverting output terminal of the secondary amplifier and another end of the eighth resistor is connected to the second output terminal of the sensor element.

3. A sensor circuit according to claim 1,
wherein, via the first resistor, one end of the seventh resistor is connected to the inverting output terminal of the secondary amplifier and another end of the seventh resistor is connected to the first output terminal of the sensor element, and
wherein, via the second resistor, one end of the eighth resistor is connected to the non-inverting output terminal of the secondary amplifier and another end of the eighth resistor is connected to the second output terminal of the sensor element.

4. A sensor circuit according to claim 1, further comprising a ninth resistor and a reference voltage generating circuit which are serially connected between a node between the fifth resistor and the sixth resistor and the ground terminal.

\* \* \* \* \*